(12) United States Patent
Hwang

(10) Patent No.: US 7,695,995 B2
(45) Date of Patent: Apr. 13, 2010

(54) IMAGE SENSOR AND METHOD OF FABRICATING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 77 days.

(21) Appl. No.: 11/900,319

(22) Filed: Sep. 10, 2007

(65) Prior Publication Data

US 2008/0073736 A1    Mar. 27, 2008

(30) Foreign Application Priority Data

Sep. 26, 2006    (KR) ...................... 10-2006-0093575

(51) Int. Cl.
*H01L 21/00* (2006.01)
(52) U.S. Cl. ............................. 438/57; 438/59; 438/65; 438/70
(58) Field of Classification Search .................. 257/57, 257/59, 65, 70
See application file for complete search history.

(56) References Cited

U.S. PATENT DOCUMENTS

| | | | | |
|---|---|---|---|---|
| 4,600,833 | A * | 7/1986 | Shibata et al. ............... | 250/216 |
| 6,369,417 | B1 | 4/2002 | Lee | |
| 6,617,189 | B1 | 9/2003 | Chen et al. | |
| 7,232,698 | B2 * | 6/2007 | Kim ............................ | 438/48 |
| 2002/0027228 | A1 | 3/2002 | Lee | |
| 2005/0090035 | A1 | 4/2005 | Kim | |

FOREIGN PATENT DOCUMENTS

| | | |
|---|---|---|
| CN | 1624900 A | 6/2005 |
| KR | 10-2002-0014519 | 2/2002 |
| KR | 10-2005-0079495 | 8/2005 |

OTHER PUBLICATIONS

Eun-Ji Kim; "Method for Fabricating CMOS Image Sensor Protecting Low Temperature Oxide Delamination"; esp@cenet; Chinese Publication No. CN1624900; Publication Date: Jun. 8, 2005; esp@cenet Database—Worldwide, http://v3.espacenet.com/publicationDetails/biblio?CC=CN&NR=16249.

Partial Chinese Office Action dated Oct. 31, 2008; Chinese Patent Application No. 2007101543556; The State Intellectual Property Office of P.R.C., People's Republic of China.

Jung Hyun Cho; Method of Forming Pad of Image Device Capable of Preventing Pad Discolor; Korean Patent Abstract; Publication No. 1020050079495 A: Publication Date: Aug. 10, 2005; Korean Intellectual Property Office, Republic of Korea.

(Continued)

*Primary Examiner*—Long Pham
(74) *Attorney, Agent, or Firm*—The Law Offices of Andrew D. Fortney; Andrew D. Fortney

(57) ABSTRACT

Disclosed is an image sensor. The image sensor includes a lower structure having a photodiode and an interconnection, a passivation layer on the lower structure, a thermo-setting resin layer on the passivation layer, a color filter array on the thermo-setting resin layer, a micro-lens array on the color filter array, and a Low Temperature Oxide (LTO) layer on the micro-lens array.

20 Claims, 3 Drawing Sheets

OTHER PUBLICATIONS

Ju Il Lee; Complmentary-Metal-Oxide-Semiconductor Image Sensor Having Low Temperature Oxide Layer for Protecting Micro Lens and Manufacturing Method Thereof; Korean Patent Abstract; Publication No. 1020020014519 A; Publication Date; Feb. 25, 2002; Korean Intellectual Property Office, Republic of Korea.

Office Action from Korean Intellectual Property Office; Dated; Sep. 20, 2007; Korean Patent Application No. 10-2006-0093575.

* cited by examiner

IMAGE SENSOR AND METHOD OF FABRICATING THE SAME

The present application claims priority under 35 U.S.C. 119 and 35 U.S.C. 365 to Korean Patent Application No. 10-2006-0093575 (filed on Sep. 26, 2006), which is hereby incorporated by reference in its entirety.

BACKGROUND

Embodiments of the invention relate to an image sensor and a method of fabricating the same.

An image sensor is a semiconductor device that converts an optical image into electrical signals. Such an image sensor includes a micro-lens array that guides incident light toward a photodiode.

One factor to be solved in fabricating an image sensor is to increase a rate (e.g., the sensitivity) of converting incident light into electrical signals. Studies and research are being pursued to realize a zero gap in which no gap exists between lenses adjacent to each other in the micro-lens array.

However, in a method for manufacturing a CMOS image sensor, delamination of a capping layer may occur in a pad open section, the pad of which serves for signal connection with exterior signal lines, due to a stress difference between layers of and/or over the pad. Also, in a wafer back grinding process, a packaging process and the like, polymer particles derived from the photoresist layer and the like may be generated and may attach to the micro-lens array. Thus, the sensitivity of an image sensor can be lowered and the yield rate can be reduced due to the difficulty of cleaning the micro-lens array.

SUMMARY

Embodiments of the invention provide an image sensor capable of improving the sensitivity and yield rate of a device, and a method of fabricating the same.

An embodiment provides an image sensor comprising: a lower structure having a photodiode and an interconnection; a passivation layer on the lower structure; a thermo-setting resin layer on the passivation layer; a color filter array on the thermo-setting resin layer; a micro-lens array on the color filter array; and a Low Temperature Oxide (LTO) layer on the micro-lens array.

Another embodiment provides a method for fabricating an image sensor, the method comprising: forming a lower structure having a photodiode and an interconnection; forming a passivation layer on the lower structure; forming a color filter array on the passivation layer; forming a micro-lens array on the color filter array; forming a Low Temperature Oxide (LTO) layer on the micro-lens array; and exposing a pad section on the lower structure by etching the LTO layer and the passivation layer.

Yet another embodiment provides a method for fabricating an image sensor, the method comprising: forming a lower structure having a photodiode and an interconnection; forming a passivation layer on the lower structure; forming a thermo-setting resin layer on the passivation layer; forming a color filter array on the thermo-setting resin layer; forming a micro-lens array on the color filter array; forming a Low Temperature Oxide (LTO) layer on the micro-lens array; and exposing a pad section on the lower structure by etching the LTO layer and the passivation layer.

DETAILED DESCRIPTION OF THE EMBODIMENTS

In the following description, it will be understood that when a layer (or film) is referred to as being 'on/above' another layer or substrate, it can be directly on another layer or substrate, or intervening layers may also be present. Further, it will be understood that when a layer is referred to as being 'below/under' another layer, it can be directly under another layer, and one or more intervening layers may also be present. In addition, it will also be understood that when a layer is referred to as being 'between' two layers, it can be the only layer between the two layers, or one or more intervening layers may also be present. Thus, the meaning thereof must be determined based on the scope of the embodiment.

Hereinafter, various embodiments of the invention will be described in detail with reference to the accompanying drawings.

An exemplary method for fabricating an image sensor will be described with reference to FIGS. 1 to 6. FIGS. 1 to 6 are cross-sectional views showing structures formed in the exemplary method for fabricating the image sensor.

Figure 1:
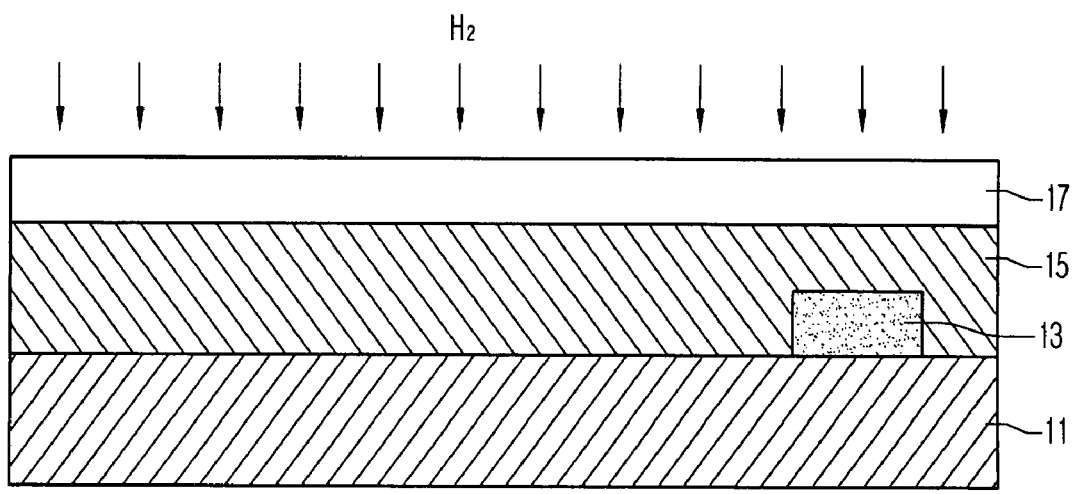
FIGS. 1 to 6 are cross-sectional views showing structures formed in an exemplary method for fabricating an image sensor.

According to one embodiment, as shown in FIG. 1, a passivation layer 15 is formed on a lower structure 11 including a photodiode (not shown) and an interconnection (not shown). A pad section 13, which serves for signal connection from the unit pixel containing the photodiode with an exterior signal line, is formed on the lower structure 11, and the passivation layer 15 is formed on the pad section 13. The passivation layer can include an oxide layer 15, and optionally, a nitride layer 17. When forming the passivation layer, the oxide layer 15 can be formed on the lower structure 11 (e.g., by chemical vapor deposition [CVD], which may be plasma-enhanced [PE-CVD] or high density plasma-assisted [HDP-CVD], from silicon-containing precursors such as silane or tetraethylorthosilicate (TEOS), and oxygen-containing precursors such as dioxygen and/or ozone) and the nitride layer 17 can be formed on the oxide layer 15 (e.g., by CVD [e.g., PE-CVD] from silicon-containing precursors such as silane and nitrogen-containing precursors such as ammonia and/or dinitrogen [the latter of which may further include hydrogen]).

In the case of forming the nitride layer 17 as the passivation layer, the nitride layer 17 may be subject to annealing in a reducing atmosphere (e.g., containing $H_2$, ammonia, silane, other hydrogenated nitrogen- and/or silicon-containing species, such as aminosilanes and silylamines, combinations thereof, or mixtures thereof with an inert gas such as dinitrogen, helium, neon, argon, etc.), so that defects in the nitride layer 17 can be cured and characteristics of the image sensor under a low illumination environment can be improved. The nitride layer 17 can include SiN-based material. For example, dangling bonds in the nitride layer 17 can be removed through the annealing process. Further, when the annealing process is performed, cracks in the oxide layer 15 due to stress with a subsequently formed LTO layer may be reduced or prevented.

Figure 2:
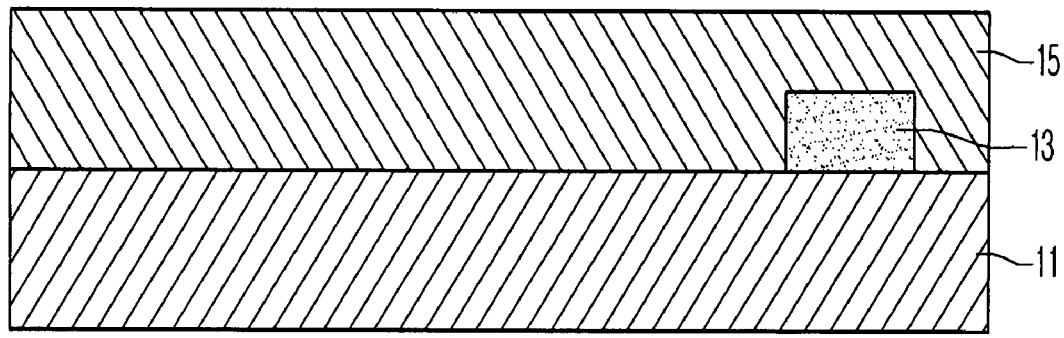

As shown in FIG. 2, the nitride layer 17 may be removed, so that the oxide layer 15 is exposed. When removing the nitride layer 17, the nitride layer 17 may be removed through an etch back process, or a Chemical Mechanical Polishing (CMP) process. Alternatively, the nitride layer 17 may be removed by wet etching (e.g., with warm or hot aqueous phosphoric acid). Although the nitride layer 17 is removed, the pad section 13 is not exposed and protected by the oxide layer 15 because the oxide layer 15 has been formed on the pad section 13.

Figure 3:
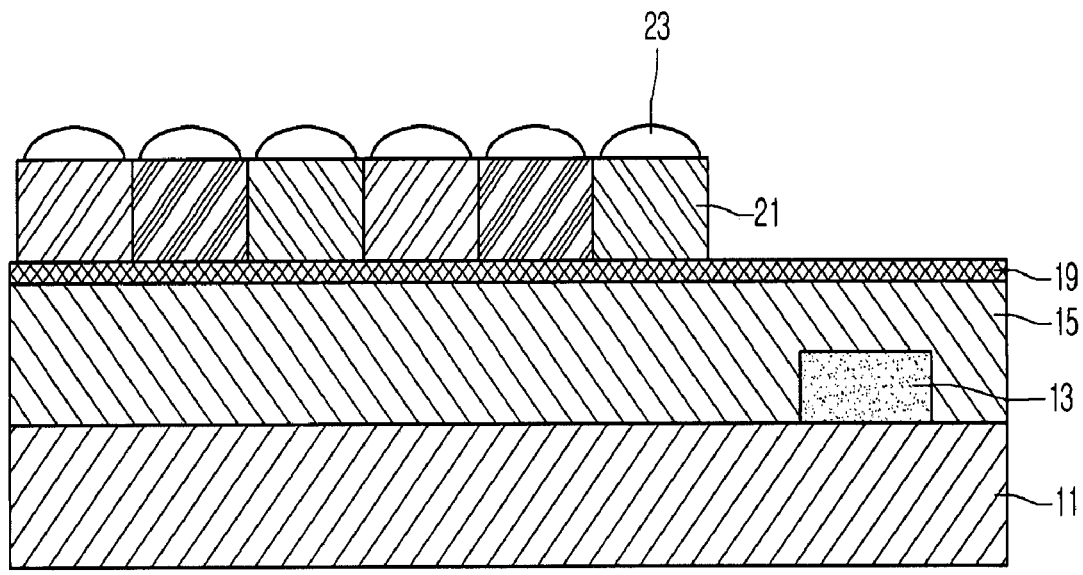

As shown in FIG. 3, a thermo-setting resin layer 19 is formed on the exposed the oxide layer 15, generally by spin-coating a solution of the thermo-setting resin on the oxide layer 15, then drying and curing the thermo-setting resin by heating (at a temperature of from 100 to 400° C., optionally in part or entirely under vacuum or in an inert gas flow, and which may be done in stages, such as a drying stage including heating at a temperature of from 100 to 150° C. for a length of time sufficient to remove substantially all of the solvent from the thermo-setting resin solution, followed by a curing stage including heating at a temperature of from 200 to 350° C. for a length of time sufficient to set the thermo-setting resin). Accordingly, defects can be reduced or prevented in the oxide layer 15. In addition, adhesive characteristics with a layer to be formed thereon can be improved. Forming the thermo-setting resin layer 19 may also be omitted depending on the design of the image sensor.

After forming the thermo-setting resin layer 19, a color filter array 21 is formed on the thermo-setting resin layer 19. The color filter array may comprise an array of red, green and blue filters (a so-called "RGB" color filter) or yellow, cyan and magenta filters (a so-called "YCM" color filter). Generally, the color filters in the array 21 comprise a conventional resist material and a dye that absorbs predetermined wavelengths of light corresponding to the color of the filter.

Then, a micro-lens array 23 is formed on the color filter array 21. For example, the micro-lens array 23 can be formed through patterning and heat treatment processes for a photoresist layer. Further, the micro-lens array 23 may also be formed after forming a planarization layer (e.g., comprising an oxide and/or nitride layer as described herein) on the color filter array 21.

After forming the micro-lens array 23, a bake (or reflow) process may be further performed for the resultant structure. Such a bake process can be performed at a temperature of 150° C. to 180° C. for 2 to 3 hours, as one example. Such a bake process can be performed in a convection oven.

Figure 4:
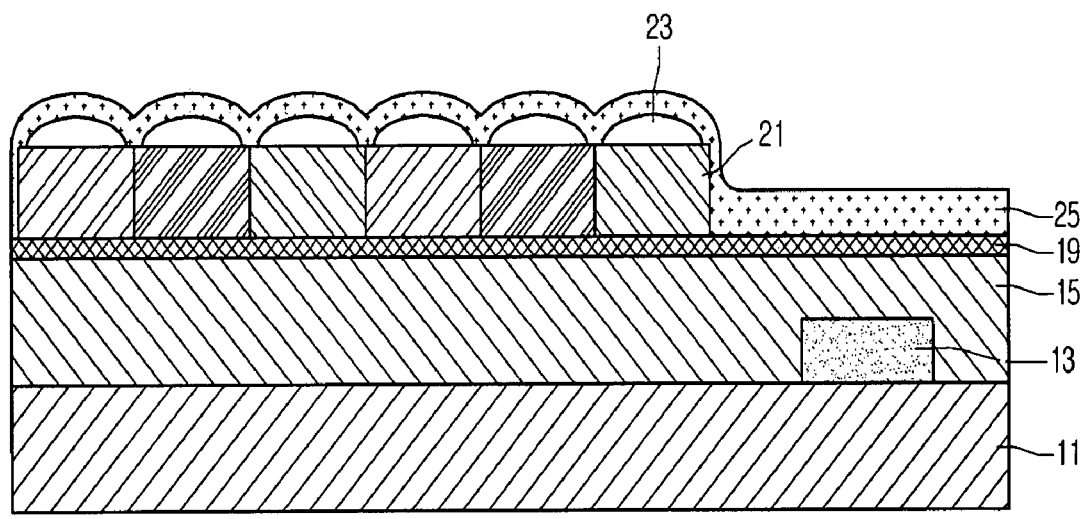

As shown in FIG. 4, a Low Temperature Oxide (LTO) layer 25 is formed on the micro-lens array 23. The LTO layer 25 can be formed above the pad section 13. In such a case, the oxide layer 15, the thermo-setting resin layer 19 and the LTO layer 25 are laminated on the pad section 13. The LTO layer 25 can have a thickness of 3,000 Å to 8,000 Å.

Further, the LTO layer 25 is formed conformally, along the curvature of the micro-lens array 23, so that the LTO layer 25 may have a micro-lens array shape, and preferably, a zero gap. In the micro-lens array 23, a gap may exist between lenses adjacent to each other. However, the LTO layer 25 can have a zero gap, in which no gap exists between lens sections adjacent to each other along horizontal and/or vertical axes (along a gap may, and often does, exist along a diagonal axis of the array).

The LTO layer 25 can be formed using a PECVD method at a temperature of 200° C. or below. For example, the LTO layer 25 can be formed from a silicon-containing precursor such a silane or TEOS, and an oxygen precursor such as dioxygen and/or ozone) using the PECVD method at a temperature of 150° C. to 200° C.

As the LTO layer 25 is formed at a relatively low temperature as described above, the color filter array 21 and the micro-lens array 23 can be prevented from deteriorating. Further, after the LTO layer 25 is formed, polymer particles can be prevented from being attached to the micro-lens array 23 in the subsequent packaging process and the like.

Figure 5:
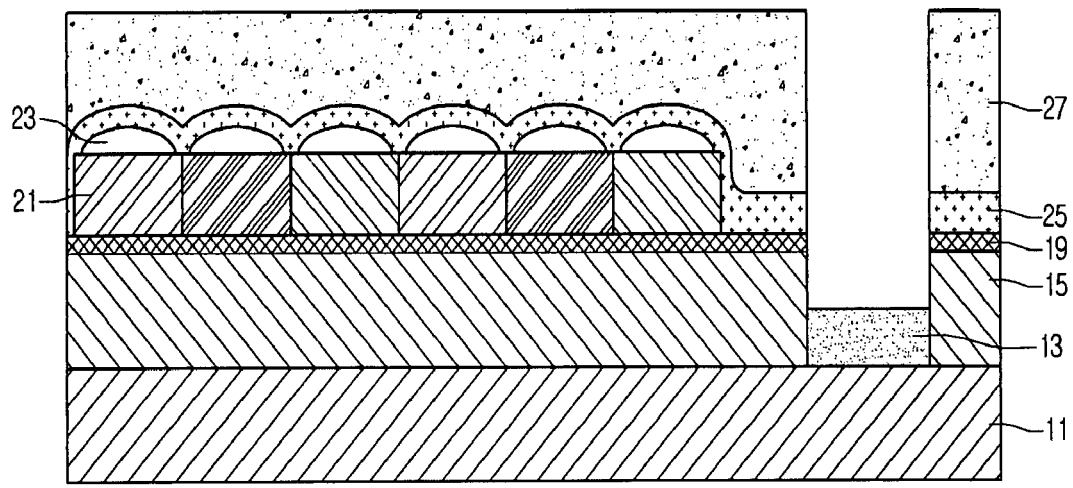

As shown in FIG. 5, the LTO layer 25, the thermo-setting resin layer 19 and the oxide layer 15 are etched, so that the pad section 13 on the lower structure 11 is exposed. For example, after forming a photoresist pattern 27 on the LTO layer 25, the photoresist pattern 27 is etched, so that the pad section 13 can be exposed.

Figure 6:
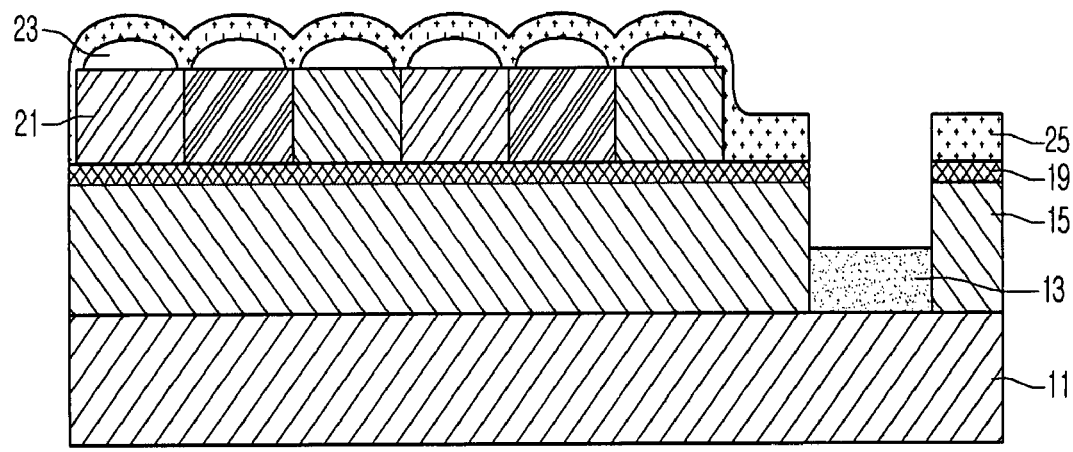

According to the method of the embodiment as described above, the pad section 13 can be easily exposed by performing a pad open process once. Then, the photoresist pattern 27 is removed, so that the image sensor according to the embodiment can be fabricated as shown in FIG. 6.

The image sensor according to various embodiments includes the lower structure 11 having the photodiode and the interconnection, and the oxide layer 15 (passivation layer) on the lower structure 11. The pad section 13 is formed on the lower structure 11, and serves for signal connection from the CMOS image sensor to an exterior signal path (e.g., bond wire, ball bond, and/or conductive trace on a printed circuit board).

The image sensor according to various embodiments includes the thermo-setting resin layer 19 on the oxide layer 15, and the color filter array 21 on the thermo-setting resin layer 19. The thermo-setting resin layer 19 may be omitted depending on the design of the image sensor.

Further, the image sensor according to various embodiments includes the micro-lens array 23 on the color filter array 21, and the LTO layer 25 on the micro-lens array 23. The LTO layer 25 is formed conformally along the curvature of the micro-lens array 23, so that the LTO layer 25 can have a micro-lens array shape, and preferably a zero gap. That is, in the micro-lens array 23, a gap may exist between lenses adjacent to each other. However, the LTO layer 25 can have a shape with a zero gap, in which no gap exists between lens sections adjacent to each other. The LTO layer 25 can have a thickness of 3,000 Å to 8,000 Å, and the thickness of the LTO layer 25 may change depending on the design of the image sensor or the formation of the zero gap.

According to the embodiments as described above, a delamination of the LTO layer can be prevented from occurring in the pad section due to a stress difference between the layers of or over the pad section. Further, in a wafer back grinding process, a packaging process and the like, polymer particles derived from a photoresist layer and the like can be prevented from being attached to the micro-lens array formed for collecting light. Accordingly, the sensitivity of the image sensor can be maximized, and the yield rate can be improved.

According to the image sensor and the fabricating method thereof as described above, the sensitivity and yield rate of the device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating an image sensor, the method comprising:
    forming a lower structure having a photodiode and an interconnection;
    forming a passivation layer on the lower structure, wherein forming the passivation layer comprises forming an oxide layer on the lower structure, forming a nitride layer on the oxide layer, annealing the nitride layer in a reducing atmosphere, and exposing the oxide layer by removing the nitride layer;
    forming a color filter array on the passivation layer;
    forming a micro-lens array on the color filter array;
    forming a Low Temperature Oxide (LTO) layer on the micro-lens array; and
    exposing a pad section on the lower structure by etching the LTO layer and the passivation layer.

2. The method as claimed in claim 1, further comprising forming a thermo-setting resin layer on the exposed oxide layer.

3. The method as claimed in claim 1, wherein the nitride layer is removed using an etch back method.

4. The method as claimed in claim 1, wherein the LTO layer has a thickness of 3,000 Å to 8,000 Å.

5. The method as claimed in claim 1, wherein the LTO layer is deposited conformally on the micro-lens array such that it has a zero gap.

6. The method as claimed in claim 1, wherein forming the LTO layer comprises depositing the LTO layer by plasma-enhanced chemical vapor deposition (PECVD).

7. The method as claimed in claim 1, wherein forming the micro-lens array comprises patterning a micro-lens material layer, and then heating a resultant structure at a temperature of 150° C. to 180° C. for 2 to 3 hours.

8. The method as claimed in claim 7, wherein the heating is performed in a convection oven.

9. A method for fabricating an image sensor, the method comprising:
    forming a lower structure having a photodiode and an interconnection;
    forming a passivation layer on the lower structure, wherein forming the passivation layer comprises forming an oxide layer on the lower structure, forming a nitride layer on the oxide layer, annealing the nitride layer in a reducing atmosphere, and exposing the oxide layer by removing the nitride layer;
    forming a thermo-setting resin layer on the passivation layer;
    forming a color filter array on the thermo-setting resin layer;
    forming a micro-lens array on the color filter array;
    forming a Low Temperature Oxide (LTO) layer on the micro-lens array; and
    exposing a pad section on the lower structure by etching the LTO layer and the passivation layer.

10. The method as claimed in claim 9, wherein the nitride layer is removed using an etch back method.

11. The method as claimed in claim 9, wherein the LTO layer has a thickness of 3,000 Å to 8,000 Å.

12. The method as claimed in claim 9, wherein forming the LTO layer comprises conformal deposition on the micro-lens array such that it has a zero gap.

13. The method as claimed in claim 9, wherein forming the LTO layer comprises depositing the LTO layer by plasma-enhanced chemical vapor deposition (PECVD).

14. The method as claimed in claim 9, wherein forming the micro-lens array comprises patterning a micro-lens material layer, and then heating a resultant structure at a temperature of 150° C. to 180° C. for 2 to 3 hours.

15. The method as claimed in claim 6, wherein the LTO layer is formed from a silicon-containing precursor selected from the group consisting of a silane and TEOS, and an oxygen precursor selected from the group consisting of dioxygen and ozone.

16. The method as claimed in claim 13, wherein the LTO layer is formed from a silicon-containing precursor selected from the group consisting of a silane and TEOS, and an oxygen precursor selected from the group consisting of dioxygen and ozone.

17. The method as claimed in claim 1, wherein the color filter array comprises an array of red, green and blue filters or yellow, cyan and magenta filters, and each filter in the color filter array comprises a resist material and a dye that absorbs predetermined wavelengths of light corresponding to a color of the filter.

18. The method as claimed in claim 13, wherein the color filter array comprises an array of red, green and blue filters or yellow, cyan and magenta filters, and each filter in the color filter array comprises a resist material and a dye that absorbs predetermined wavelengths of light corresponding to a color of the filter.

19. The method as claimed in claim 1, further comprising forming a photoresist pattern on the LTO layer before etching the LTO layer and the passivation layer, then removing the photoresist pattern.

20. The method as claimed in claim 13, further comprising forming a photoresist pattern on the LTO layer before etching the LTO layer and the passivation layer, then removing the photoresist pattern.

* * * * *